(12) United States Patent
Nakahashi et al.

(10) Patent No.: US 7,233,037 B2
(45) Date of Patent: Jun. 19, 2007

(54) SOLID STATE IMAGING DEVICE AND METHOD OF MANUFACTURING THE SAME

(75) Inventors: Yousuke Nakahashi, Miyagi (JP); Hiroaki Takao, Miyagi (JP); Makoto Shizukuishi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 41 days.

(21) Appl. No.: 11/159,367

(22) Filed: Jun. 23, 2005

(65) Prior Publication Data

US 2006/0011953 A1 Jan. 19, 2006

(30) Foreign Application Priority Data

Jun. 25, 2004 (JP) ............... P.2004-188404

(51) Int. Cl.
*H01L 31/062* (2006.01)
(52) U.S. Cl. ............... 257/291; 257/757
(58) Field of Classification Search ........ 257/291, 257/797
See application file for complete search history.

(56) References Cited

U.S. PATENT DOCUMENTS 5,817,562 A * 10/1998 Chang et al. ............ 438/305
6,656,840 B2 * 12/2003 Rajagopalan et al. ..... 438/687
2005/0274995 A1 * 12/2005 Park ....................... 257/291

FOREIGN PATENT DOCUMENTS

JP        8-274302 A       10/1996

* cited by examiner

*Primary Examiner*—Roy Potter
(74) *Attorney, Agent, or Firm*—Birch, Stewart, Kolasch & Birch, LLP

(57) ABSTRACT

A solid-state imaging device including a photoelectric conversion portion and a charge transfer portion equipped with charge transfer electrodes to transfer the charge generated in the photoelectric conversion portion, wherein the charge transfer portion is provided with a charge transfer electrodes having a first electrode including a first layer electric conductive film, and a second electrode having a second layer electric conductive film provided contiguously to the first electrode with an electrode insulating film therebetween, and the first electrode is coated with a silicon oxide film that is the electrode insulating film formed by side wall oxidation in the state that the upside is coated with an antioxidizing film so as to coat the side wall.

9 Claims, 5 Drawing Sheets

SOLID STATE IMAGING DEVICE AND METHOD OF MANUFACTURING THE SAME

BACKGROUND OF THE INVENTION

1. Field of the Invention

The present invention relates to a solid-state imaging device and a method of manufacturing the same, in particular relates to the reduction of a leak between electrodes.

2. Description of the Related Art

A solid-state imaging device using CCD used in an area sensor has a photoelectric conversion portion such as diode, and a charge transfer portion equipped with charge transfer electrodes for transferring the signal from the photoelectric conversion portion. The charge transfer electrodes are arranged on a charge transfer line formed on a semiconductor substrate such that a plurality of charge transfer electrodes are arranged contiguously and driven in sequence.

In recent years, in the solid-state imaging device, demands for the increase of resolution and sensitivity go on rising, and the increase of imaging pixel number has reached giga pixel or higher. A substrate in which a solid state imaging device is built (a silicone substrate) is packaged by laminating a filter and lens. Therefore, the accuracy of the positioning of a lens and a photoelectric conversion portion is important, and the distance, i.e., the distance in the height direction, is also a great problem in the positioning accuracy in manufacturing process and in the aspect of sensitivity (photoelectric transfer efficiency) at the time of use.

Further, for achieving higher resolution in such a situation without enlarging the chip size of a solid-state imaging device, it is necessary to reduce area per a unit pixel and to devise higher integration. On the other hand, as the reduction of the area of photodiode constituting a photoelectric conversion portion results in the reduction of sensitivity, the area of photodiode region must be ensured.

Accordingly, various studies are carried on for the purpose of miniaturizing the chip size of a solid-state imaging device while securing the occupied area of a photodiode region by fining a charge transfer portion and the wiring of the peripheral circuits to thereby reduce the area ratio of wiring.

To realize the elevation of integration by fining wiring under these circumstances, the improvement of pressure resistance of a layer insulating film between a charge transfer portion and a wiring layer and thinning are important technical problems in addition to the flattening of surface.

For example, a structure comprising a charge transfer portion of a single layer electrode structure is proposed for the improvement of flatness (e.g., JP-A-8-274302). For the realization of the structure, the pattern of a first electrode is formed by a first layer electric conductive film, thereafter an electrode insulating film is formed by thermal oxidation, and a second layer electric conductive film is formed as the upper layer.

In related art solid-state imaging devices using charge transfer electrodes of a single layer structure, a polycrystal silicon or amorphous silicon layer is used as the charge transfer electrodes, and after a first layer wiring is formed, the pattern surface of the first layer wiring is coated with a silicon oxide film by thermal oxidation of the pattern surface, a polycrystal silicon or amorphous silicon layer of a second transfer electrode is laminated thereon, and then polishing is carried out by a CMP (chemical mechanical polishing) method, or resist is coated and entire etching is carried out according to a resist etch back method, thereby making a single layer of electrode is achieved.

For example, in related art methods as shown in FIG. 6, silicon oxide film 2a, silicon nitride film 2b and silicon oxide film 2c are formed on the surface of n-type silicon substrate 1 to form gate oxide film 2 of three-layer structure.

Subsequently, a first layer doped polysilicon film 3a is formed on gate oxide film 2 and patterned by the photolithography, and then silicon oxide film 5, which becomes an electrode insulating film, is formed by thermal oxidation.

A second layer doped polysilicon film is formed with silicon oxide film 5 as an electrode insulating film and flattened by a CMP or resist etch back method.

However, in the thermal oxidation process, horn-like protrusion T is sometimes formed. It has been found that this phenomenon becomes particularly conspicuous as the heating temperature in a thermal oxidation process lowers.

That is, thermal oxidation is conventionally mainly carried out at 950° C. or so, but a design rule also becomes minute with the fining and higher integration of a solid-state imaging devices, and the temperature of thermal oxidation is in tendency of being reduced to 900° C. or so, further 850° C. or so. It has been found that this problem is particularly conspicuous when thermal oxidation is performed at a low temperature.

Although details are unknown, it is thought that a horn-like protrusion grows at the upper edge part of the first electrode by the influence of stress and heat due to oxidation.

In the case of a single layer electrode structure, for example, a second doped polysilicon film is formed as the upper layer and flattened by CMP or resist etch back and, at the same time, the second doped polysilicon film is separated, a second electrode comprising the second layer doped polysilicon film (not shown) is formed between first electrode 3a comprising the first layer doped polysilicon film.

In this case, there is a problem that short circuit is liable to occur by the growth of protrusion T in the vicinity of the edge of the upper end of the electrode.

On the other hand, in the case of a double electrode structure, as shown in FIG. 7, second layer doped polysilicon film 3b is formed so as to overlap with a first electrode comprising a first layer doped polysilicon film 3a coated with silicon oxide film 5, and patterned by a desired mask formed by photolithography to thereby form a second electrode.

In particular in this structure, there is a problem that short circuit is liable to occur by the growth of protrusion T at the vicinity of the edge of the upper end of the electrode.

Thus, there are various problems in related art solid state imaging devices attributable to the growth of protrusion T in the vicinity of the upper edge of the pattern of the first layer electric conductive film by thermal oxidation, that is, the reduction of film quality of the insulating film between two contiguous electrodes, i.e., between the first and second electrodes, the reduction of electric pressure resistance, the reduction of step coverage, and the increase of the probability of occurrence of a leak.

SUMMARY OF THE INVENTION

The present invention has been performed in view of these circumstances, and an object of the invention is to improve the film quality of an electrode insulating film in charge transfer electrodes.

Another object of the invention is to inhibit a leak in an electrode insulating film between a first electrode comprising a first layer electric conductive film and a second electrode comprising a second layer electric conductive film in charge transfer electrodes and to improve pressure resistance.

Accordingly, a solid-state imaging device in the invention comprises a photoelectric conversion portion and a charge transfer portion equipped with charge transfer electrodes to transfer the charge generated in the photoelectric conversion portion, wherein the charge transfer portion comprises a charge transfer electrodes including a first electrode comprising a first layer electric conductive film, and a second electrode comprising a second layer electric conductive film provided contiguously to the first electrode with an electrode insulating film therebetween, wherein the first electrode is coated with a silicon oxide film, and the silicon oxide of a side wall thereof is the electrode insulating film formed by oxidation of the side wall in a state that an upside thereof is coated with an antioxidizing film.

According to this constitution, the first electrode is subjected to oxidation of the side wall in the state of being coated with an antioxidizing film such as a silicon nitride film formed by a reduced pressure CVD method, so that the stress from the upside is reduced, the growth of protrusion T is reduced, and the occurrence of a leak between electrodes can be reduced.

The solid-state imaging device in the invention includes a solid-state imaging device wherein the antioxidizing film is formed by a CVD method on the first electrode with a silicon oxide film between.

According to this constitution, the growth of the protrusion can be prevented by the presence of the silicon oxide film formed by a CVD method as a buffer.

The solid-state imaging device in the invention includes a solid-state imaging device wherein the antioxidizing film is a silicon nitride film.

According to this constitution, by using silicon nitride that effectively functions as an antioxidizing film, the improvement of reliability can be devised. Further, when the base is a silicon oxide film, the upside constituted by a double film of a silicon oxide film and a silicon nitride film, so that insulation is improved, and film thinning is possible while increasing insulation pressure resistance. In addition, the double film of a silicon oxide film and a silicon nitride film is effective as a mask for amorphous silicon or polysilicon patterning, and this double film can be used not only as a mask for patterning of the first electrode but also as an insulating film as it is, thus the number of processes can be reduced.

The solid-state imaging device in the invention includes a solid-state imaging device wherein the first and second electrodes are juxtaposed to each other on the surface of a semiconductor substrate with a gate oxide film therebetween to constitute a single layer structural charge transfer electrode.

According to this constitution, since the electrode insulating film having a good film quality is used, a leak can be certainly reduced in a single layer structural charge transfer electrodes.

The solid-state imaging device in the invention includes a solid-state imaging device wherein the second electrode is formed so as to overlap with a part of the upper layer of the first electrode and constitute a double electrode structural charge transfer electrodes.

According to this constitution, since giving and receiving of electric charge are mainly done in the vicinity of the upper edge of the first electrode, a leak can be certainly reduced in a double structural charge transfer electrodes by the use of the electrode insulating film having a good film quality.

The solid-state imaging device in the invention includes a solid-state imaging device that is constituted so that an antioxidizing film is not present in the region where the first and second electrodes are opposite to each other.

According to this constitution, an antioxidizing film is not present in the vicinity of the upper edge of the first electrode and the upper edge has the same dielectric constant as that of the side wall, and it follows that uniform electrode insulating films are present all around the region, so that the convergence of the electric field can be inhibited and reliability can be improved.

The solid-state imaging device in the invention includes a solid-state imaging device wherein the first layer electric conductive film or the second layer electric conductive film is a silicon-based electric conductive film.

The solid-state imaging device in the invention includes a solid-state imaging device wherein the silicon-based electric conductive film is a doped amorphous silicon film.

The solid-state imaging device in the invention includes a solid-state imaging device wherein the silicon-based electric conductive film is a doped polysilicon film.

A method of manufacturing a solid-state imaging device comprising a photoelectric conversion portion and a charge transfer portion equipped with charge transfer electrodes to transfer the charge generated in the photoelectric conversion portion comprises a step of forming a pattern of a first layer electric conductive film constituting a first electrode on the surface of a semiconductor substrate on which a gate oxide film is formed, a step of forming an antioxidizing film on the first layer electric conductive film constituting the first electrode, a step of forming an insulating film that is an electrode insulating film on at least the side wall of the first electrode in the presence of the antioxidizing film by thermal oxidation, and a step of forming a second layer electric conductive film constituting a second electrode on the surface of the semiconductor substrate on which the first electrode and the electrode insulating film are formed.

According to this method, since an insulating film that is an electrode insulating film is formed on at least the side wall of the first electrode in the presence of the antioxidizing film by thermal oxidation, an electrode insulating film that is precise and high quality can be formed, and an oxide film hardly grows on the upside of the first electrode, so that stress is reduced, the growth of protrusion T is reduced even in low temperature formation, and a highly reliable electrode insulating film can be formed.

The method of manufacturing a solid-state imaging device in the invention includes a manufacturing method in which the step of forming the antioxidizing film is a reduced pressure CVD process.

By this constitution, the antioxidizing film can be formed according to a reduced pressure CVD process without giving stress to the first electrode, so that the growth of a protrusion can be more certainly inhibited.

The method of manufacturing a solid-state imaging device in the invention include a manufacturing method wherein a step of forming a silicon oxide film on the first layer electric conductive film by a high temperature CVD method is included prior to the step of forming the antioxidizing film.

According to this constitution, the reduction of stress can be devised by forming a silicon oxide film as the base of the antioxidizing film by a CVD method.

The method of manufacturing a solid-state imaging device in the invention includes a manufacturing method in which the step of forming the silicon oxide film by the high temperature CVD method and the step of forming the antioxidizing film on the upper layer thereof are performed prior to the patterning of the first layer electric conductive film, and the patterning of the first layer electric conductive film is performed by using a mask pattern obtained by the patterning of the silicon oxide film and the antioxidizing film.

According to this constitution, by using the antioxidizing film and the silicon oxide film as the mask pattern, they effectively function as the mask and also function as the antioxidizing film to reduce stress in the formation of the insulating film on the side wall by thermal oxidation, and high insulating pressure resistance can be obtained at the time of use as the double film of the silicon oxide film and the silicon nitride film.

The method of manufacturing a solid-state imaging device in the invention includes a manufacturing method wherein a step of removing the protrusion of the second layer electric conductive film protruding on the first electrode to thereby flatten the surface is included.

According to this constitution, a charge transfer electrode of a single layer electrode structure can be obtained without the possibility of a leak between electrodes and with a high yield.

The method of manufacturing a solid-state imaging device in the invention includes a manufacturing method wherein a step of removing the antioxidizing film is included prior to the step of forming the second layer electric conductive film, and a step of patterning the second layer electric conductive film with leaving the region overlapping with the first electrode is included posterior to the step of forming the second layer electric conductive film.

According to this constitution, a charge transfer electrode of a double electrode structure can be obtained without the possibility of a leak between electrodes and with a high yield.

The method of manufacturing a solid-state imaging device in the invention includes a manufacturing method in which the first layer electric conductive film or the second layer electric conductive film is a silicon-based electric conductive film.

The method of manufacturing a solid-state imaging device in the invention includes a manufacturing method in which the silicon-based electric conductive film is a doped amorphous silicon film.

The method of manufacturing a solid-state imaging device in the invention includes a manufacturing method in which the silicon-based electric conductive film is a doped polysilicon film.

The invention can provide a solid-state imaging device that is capable of inhibiting the occurrence of a leak attributable to the growth of a protrusion by stress in thermal oxidation, high in yield and reliability.

Further, the method of the invention can provide, in particular in fining of the solid-state imaging device, a highly reliable device structure while reducing the heat treatment temperature such as thermal oxidation in a degree of not generating the extension of diffusion length.

Figure 1:
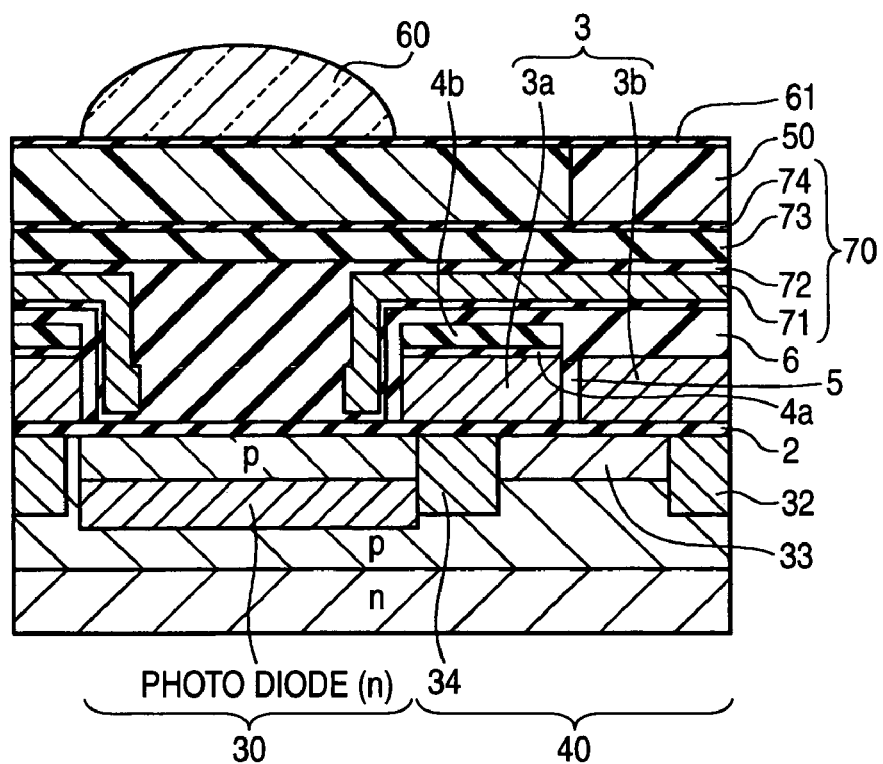
FIG. 1 is a cross sectional drawing showing the first embodiment of the solid-state imaging device according to the invention.

Reference numerals are used to identify various elements in the drawings including the following:
1: Silicon substrate
2: Gate oxide film
3a: First electrode (first layer doped polysilicon film)
3b: Second electrode (second layer doped polysilicon film)
3: Charge transfer electrode
4a: Silicon oxide film
4b: Silicon nitride film (antioxidizing film)
5: Electrode insulating film
6: Silicon oxide film
7: Silicon oxide film
30: Photodiode region
40: Charge transfer portion
50: Color filter
60: Micro lens
70: Intermediate layer

DETAILED DESCRIPTION OF THE INVENTION

The mode for carrying out the invention is described with reference to the accompanying drawings.

Figure 2:
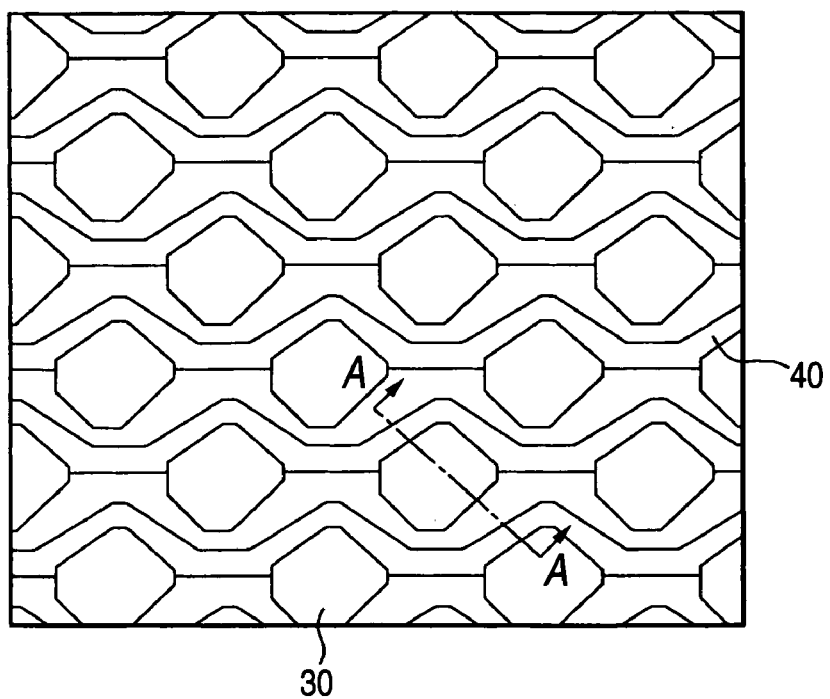
FIG. 2 is an explanatory drawing of the principal part showing the first embodiment of the solid-state imaging device according to the invention.

First Embodiment:

In this embodiment, as the schematic cross sectional view and the plan view are shown in FIGS. 1 and 2, and the electrode forming process is shown in FIGS. 3A to 3D, the solid-state imaging device is equipped with charge transfer electrodes of a single layer electrode structure, wherein silicon oxide film 5 of the side wall that is the electrode insulating film is formed by thermal oxidation in the state of being coated with the pattern of the first electrode comprising the first layer electric conductive film the upside of which is coated with silicon oxide film 4a that is an HTO film and silicon nitride film 4b formed by a reduced pressure CVD method.

As shown in a schematic plan view in FIG. 2, a plurality of photodiode regions 30 constituting the photoelectric conversion portion are formed on silicon substrate 1, and charge transfer portion 40 to transfer the signal charge detected by photodiode is formed among photodiode regions 30. FIG. 1 is a cross section obtained by being cut along line A—A in FIG. 2.

Charge transfer channel 33 in which the signal charge transferred by charge transfer electrodes moves is not shown in FIG. 1, but charge transfer channel 33 is formed in the direction crossing the extending direction of charge transfer portion 40.

In FIG. 2, of electrode insulating films 5, those formed in the vicinity of the boundary of the photodiode region and charge transfer portion 40 are now shown.

As shown in FIG. 1, photodiode region 30, charge transfer channel 33, channel stop region 32, and charge read-out region 34 are formed in silicon substrate 1, and gate oxide film 2 is formed on the surface of silicon substrate 1. Electrode insulating film 5 of a silicon oxide film and charge transfer electrodes (first electrode comprising first layer doped polysilicon film 3a, second electrode comprising second layer doped polysilicon film 3b) are formed on the surface of gate oxide film 2.

Charge transfer portion 40 is as described above, intermediate layer 70 is formed on the upside of the charge transfer electrode of charge transfer portion 40 as shown in FIG. 1. 71 is a light-shielding film, 72 is an insulating film comprising BPSG (borophospho silicate glass), 73 is an insulating film (a passivation film) comprising P—SiN, and 74 is a flattening layer comprising a transparent resin film.

On the upside of the solid-state imaging device, light-shielding film 71 is provided exclusive of the photo-detecting portion of photodiode region 30, further, color filter 50 and micro-lens 60 are provided. Between color filter 50 and micro-lens 60, flattening layer 61 comprising an insulating transparent resin is filled.

Also in FIG. 2, a solid-state imaging device of a so-called honeycomb structure is shown, but a solid-state imaging device of square lattice type is of course applicable to the invention.

The manufacturing processes of the solid-state imaging device are described in detail with reference to FIG. 3A to FIG. 3D.

In the first place, silicon oxide film 2a having a thickness of from 15 to 35 nm, silicon nitride film 2b having a thickness of 50 nm, and silicon oxide film 2c having a thickness of from 5 to 10 nm are formed on the surface of n-type silicon substrate 1 having impurity concentration of $1.0 \times 10^{16}$ cm$^{-3}$ or so to thereby form gate oxide film 2 having a three-layer structure.

Subsequently, as the first layer electric conductive film, e.g., phosphorus doped first layer doped polysilicon film 3a having a thickness of from 0.25 to 0.4 μm is formed on gate oxide film 2 according to a reduced pressure CVD method using PH$_3$- and N$_2$-added SiH$_4$ as the reactive gas. The substrate temperature at this time is from 500 to 650° C.

In the next place, silicon oxide film 4a having a thickness of 15 nm is formed at a substrate temperature of 750° C. according to a reduced pressure CVD method, and as the antioxidizing film, e.g., silicon nitride film 4b having a thickness of from 50 to 150 nm is formed according to a reduced pressure CVD method.

After that, positive resist is coated as the upper layer thereof in a thickness of from 0.5 to 1.4 μm, and the positive resist is subjected to exposure by photolithography with a desired mask, development, water washing, thereby a resist pattern is formed.

Thereafter, silicon oxide film 4a and silicon nitride film 4b are subjected to etching treatment by means of reactive ion etching with mixed gas of CHF$_3$, C$_2$F$_6$, O$_2$ and He to form a mask pattern for the patterning of first layer doped polysilicon film 3a. The mask pattern is used as it is as the antioxidizing film in the oxidation step of the side wall.

The resist pattern is peeled off by ashing.

Figure 3A:
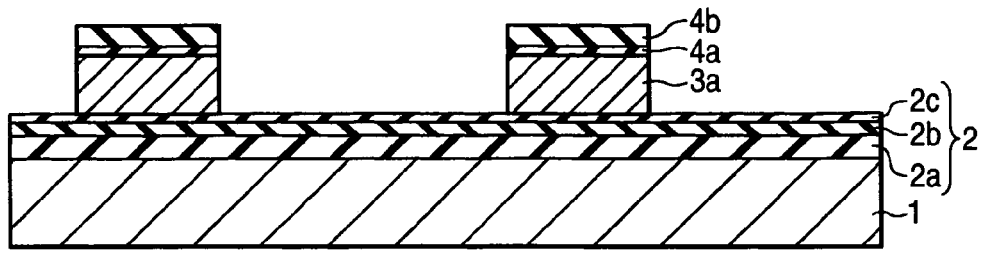
FIG. 3 is a drawing showing the manufacturing process of the first embodiment of the solid-state imaging device according to the invention.

Thereafter, first layer doped polysilicon film 3a is selectively removed by reactive ion etching, with silicon nitride film 2b of gate oxide film 2 as an etching stopper and the mask pattern as a mask, by using mixed gas of HBr and O$_2$, to thereby form the first electrode and the wiring of the peripheral circuit (not shown) (FIG. 3A). It is preferred to use here an etching apparatus such as ECR (Electron Cycrotoron Resonance) system or ICP (Inductively Coupled Plasma) system.

Figure 3B:
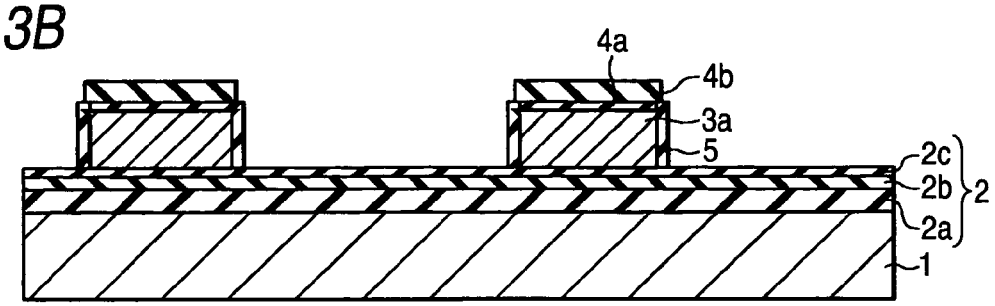

Subsequently, electrode insulating film 5 comprising a silicon oxide having a thickness of from 80 to 90 nm is formed in the vicinity including the sides of the pattern of the first electrode by a thermal oxidation method (FIG. 3B). Here the temperature of thermal oxidation is 900° C. or so, preferably 850° C., by which the extension of diffusion length can be prevented. Since the thermal oxidation is carried out in the state of coating the upside of the first electrode with an antioxidizing film, i.e., silicon nitride film 4b, stress is relaxed and the growth of protrusion T is inhibited.

In the next place, as the second electric conductive film, e.g., second layer doped polysilicon film 3b having a thickness of from 0.4 to 0.7 μm is formed according to a reduced pressure CVD method using reactive gas obtained by adding PH$_3$ and N$_2$ to SiH$_4$ gas. At this time, it is necessary that the thickness of second layer doped polysilicon film 3b should be almost the same with or thicker than the total thickness of the first layer doped polysilicon film and silicon oxide film 4a and silicon nitride film 4b of the upper layer.

After that, a resist (not shown) is coated, and etching is carried out all over the surface on the condition that the etching speeds of the resist and second layer doped polysilicon film 3b are almost equal, and second layer doped polysilicon film 3b is flattened.

Thereafter, the resist pattern for forming the active region and the peripheral circuit is formed (not shown). Here, the resist pattern is formed so as to coat the area where the solid-state imaging device is formed and a part of the peripheral circuit area.

With the resist pattern as the mask, second layer doped polysilicon film 3b on photodiode region 30 is removed by etching, and other pattern of the peripheral circuit (not shown) is left behind.

Figure 3C:
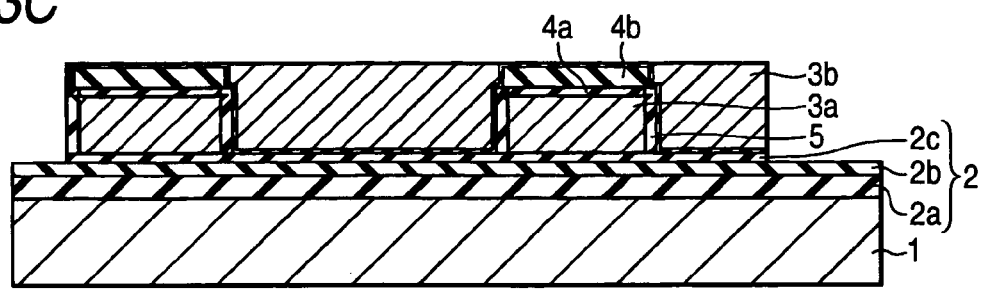

By removing the resist by ashing, second layer doped polysilicon film 3b is formed so as to coat the area where the solid-state imaging device is formed and a part of the peripheral circuit area (FIG. 3C).

Figure 3D:
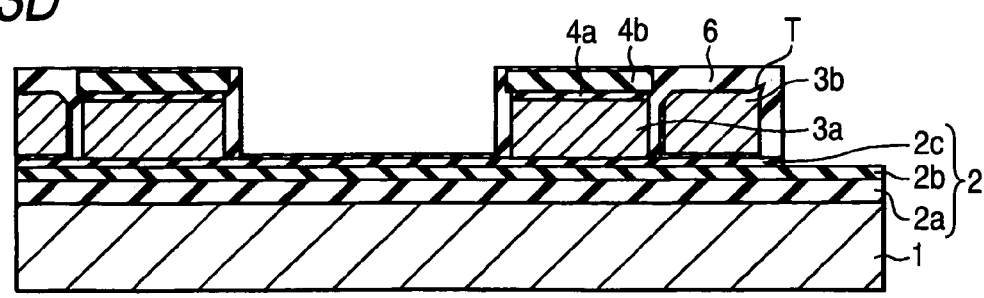

Thus, the second electrode comprising second layer doped polysilicon film 3b is formed, silicon oxide film 6 is formed around the second electrode by thermal oxidation, and charge transfer electrode 3 of a single layer electrode structure is formed (FIG. 3D).

As the upper layers thereon, the pattern of light-shielding film 71 and BPSG film 72 having a thickness of 700 nm are formed and flattened at 850° C. by reflowing. And then, insulating film 73 (a passivation film) comprising P—SiN, and flattening layer 74 comprising a transparent resin film are formed.

After that, color filter 50, flattening layer 61 and micro-lens 60 are formed, thus a solid-state imaging device as shown in FIGS. 1 and 2 is obtained.

According to the method, a high quality silicon oxide film is formed on the side wall according to thermal oxidation by using, as the antioxidizing film, a double film comprising a high quality silicon oxide film formed by a high temperature CVD method and a silicon nitride film formed by a reduced pressure CVD method, so that a high pressure resisting and highly reliable electrode insulating film can be formed. The silicon oxide film and the silicon nitride film are also used as the mask pattern for patterning of the first electrode comprising the first layer electric conductive film, and so the formation can be carried out without the increase of the number of processes. Further, the surface of the first electrode is the double structure comprising dense silicon oxide film 4a formed by a high temperature CVD method and a silicon nitride film, so that the pressure resistance of the upside is good and more thinning is possible. Thus, a fine and high sensitivity solid-state imaging device can be formed.

In addition, since the first layer electric conductive film is coated with a stopper comprising silicon oxide film 4a and silicon nitride film 4b as the upper layer, a desired thickness of the first electrode can be maintained not being etched in a etch-back process.

Further, when a CMP process is used in place of the etch-back process for flattening the double film comprising silicon oxide film 4a and silicon nitride film 4b, the double film also functions as a stopper, so that film decrease can be prevented.

The film thickness of silicon nitride as an antioxidizing film is preferably from 50 to 150 nm or so. However, a silicon nitride film as an antioxidizing film may be removed after a silicon oxide film as a side wall insulating film is formed.

Figure 4:
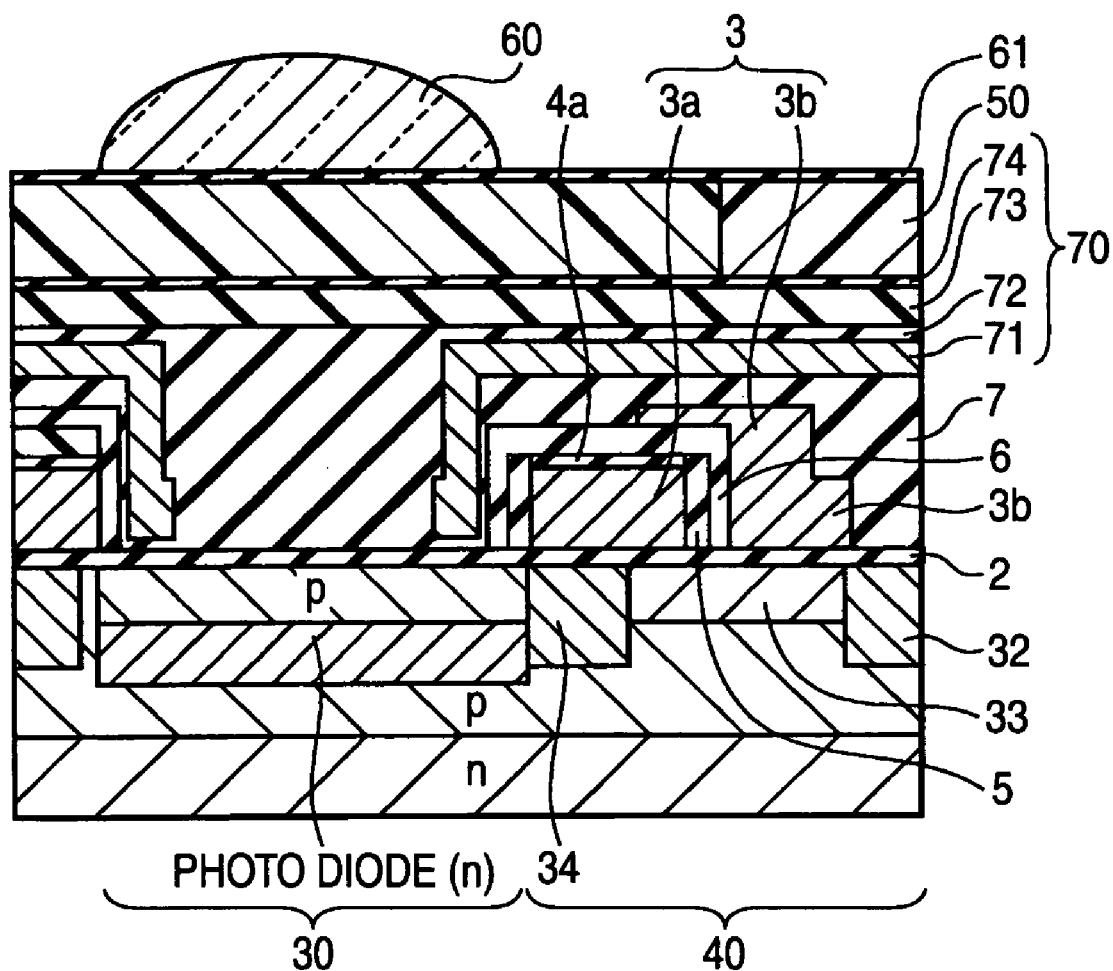
FIG. 4 is a cross sectional drawing showing the second embodiment of solid-state imaging device according to the invention.
Figure 5A:
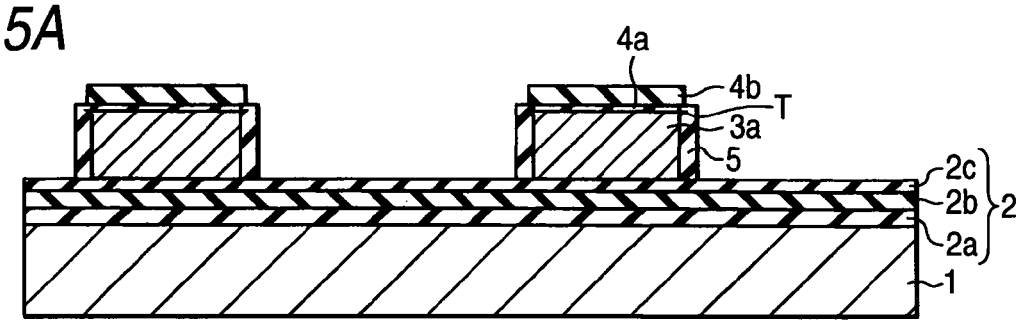
FIG. 5 is a drawing showing the manufacturing process of the second embodiment of the solid-state imaging device according to the invention.
Figure 5B:
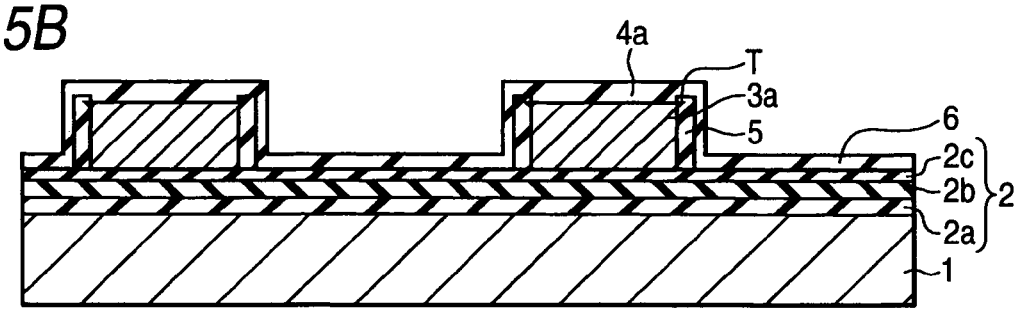
Figure 5C:
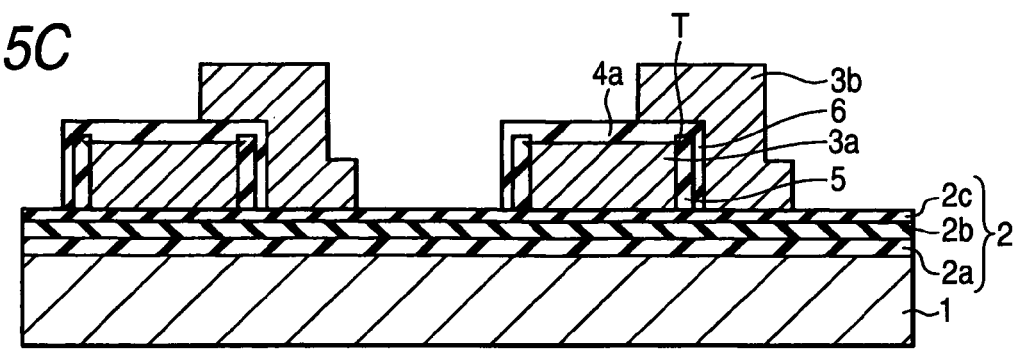
Figure 6:
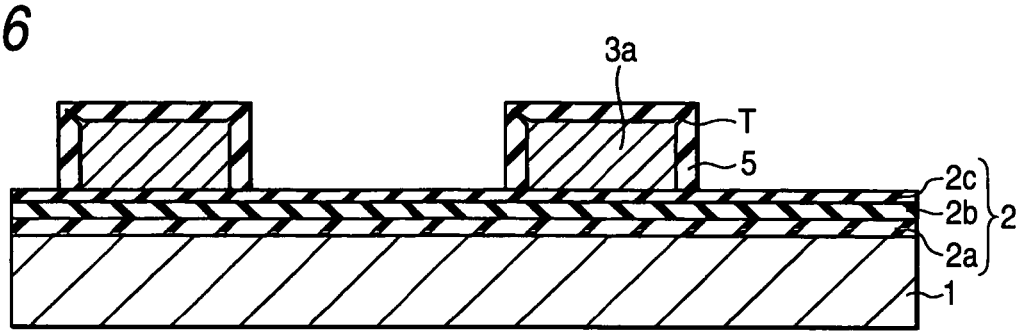
FIG. 6 is a drawing showing the manufacturing process of a related art solid-state imaging device.
Figure 7:
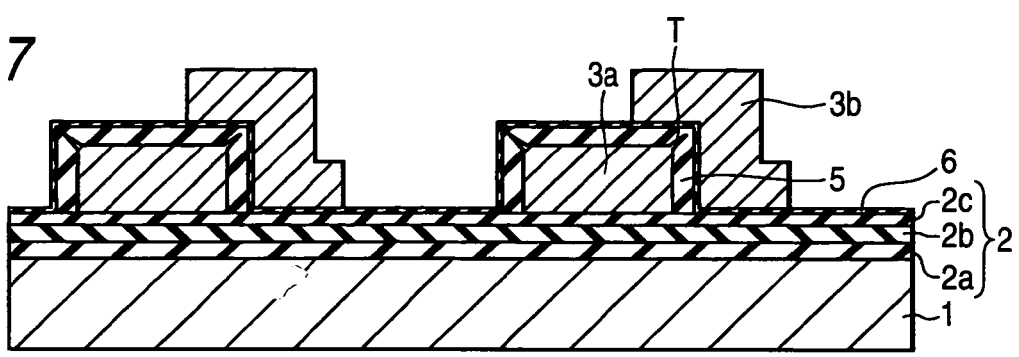
FIG. 7 is a drawing showing the manufacturing process of a related art solid-state imaging device.

Second Embodiment:

In the first embodiment, the case where charge transfer portion having a single layer electrode structure is used is explained, and the first embodiment is also applicable to charge transfer portion of a double electrode structure. FIG. 4 is a schematic cross sectional drawing showing the solid-state imaging device in the second embodiment. FIGS. 5A to 5C are drawings showing the manufacturing process of the electrode. The second embodiment is the same as the first embodiment except for forming a solid-state imaging device equipped with charge transfer electrodes having a double electrode structure in place of a single layer electrode structure. That is, silicon oxide film 5 of the side wall that is the electrode insulating film is formed by thermal oxidation in the state of being coated with the pattern of the first electrode comprising the first layer electric conductive film the upside of which is coated with silicon oxide film 4a that is an HTO film and silicon nitride film 4b formed by a reduced pressure CVD method. Further, silicon nitride film 4b of the first electrode opposing to the second electrode is removed. Here, silicon nitride film 4b is removed all over the upside of the first electrode.

The schematic plan view of the second embodiment is the same as that of the first embodiment shown in FIG. 2. A plurality of photodiode regions 30 constituting the photoelectric conversion portion are formed on silicon substrate 1, and charge transfer portion 40 to transfer the signal charge detected by photodiode is formed among photodiode regions 30. FIG. 4 is a cross section obtained by being cut along line A—A in FIG. 2.

The parts other than the charge transfer electrodes are the same as those in the first embodiment, so that explanation is omitted.

The manufacturing processes of the solid-state imaging device are described in detail with reference to FIG. 5A to FIG. 5C.

In the first place, the first electrode is manufactured in the same manner as in the first embodiment. That is, silicon oxide film 2a having a thickness of from 15 to 35 nm, silicon nitride film 2b having a thickness of 50 nm, and silicon oxide film 2c having a thickness of from 5 to 10 nm are formed on the surface of n-type silicon substrate 1 having impurity concentration of $1.0 \times 10^{16}$ cm$^{-3}$ or so to thereby form gate oxide film 2 having a three-layer structure.

Subsequently, as the first layer electric conductive film, e.g., phosphorus doped first layer doped polysilicon film 3a having a thickness of from 0.3 to 0.4 μm is formed on gate oxide film 2 according to a reduced pressure CVD method using $PH_3$- and $N_2$-added $SiH_4$ as the reactive gas.

In the next place, silicon oxide film 4a having a thickness of 15 nm is formed at a substrate temperature of 750° C. according to a reduced pressure CVD method, and as the antioxidizing film, e.g., silicon nitride film 4b having a thickness of from 50 to 150 nm is formed according to a reduced pressure CVD method.

After that, silicon oxide film 4a and silicon nitride film 4b are subjected to etching treatment with a resist pattern formed by photolithography as the mask to form a mask pattern for the patterning of first layer doped polysilicon film 3a. A mask pattern of dummy is formed to the left of the original mask pattern for forming the first electrode.

The resist pattern is peeled off by ashing.

Thereafter, first layer doped polysilicon film 3a is selectively removed by reactive ion etching, with silicon nitride film 2b of gate oxide film 2 as an etching stopper and the mask pattern as a mask, by using mixed gas of HBr and $O_2$, to thereby form the first electrode and the wiring of the peripheral circuit (not shown).

Subsequently, electrode insulating film 5 comprising a silicon oxide having a thickness of from 80 to 90 nm is formed in the vicinity including the sides of the pattern of the first electrode by a thermal oxidation method. Here the temperature of thermal oxidation is 900° C. or so, preferably 850° C., by which the extension of diffusion length can be prevented. Since the thermal oxidation is carried out in the state of coating the upside of the first electrode with an antioxidizing film, i.e., silicon nitride film 4b, stress is relaxed and the growth of protrusion T is inhibited. After the electrode insulating film formation, silicon nitride film 4b is removed by etching (FIG. 5A).

In the next place, after forming silicon oxide film (HTO) film 6 around the first electrode by a reduced pressure CVD method (FIG. 5B), as the second electric conductive film, e.g., second layer doped polysilicon film 3b having a thickness of from 0.3 to 0.5 μm is formed according to a reduced pressure CVD method using reactive gas obtained by adding $PH_3$ and $N_2$ to $SiH_4$ gas.

After that, a resist (not shown) is coated, and patterning of second layer doped polysilicon film 3b (FIG. 5 C). At this time, in the second embodiment, the second electrode is formed by performing patterning so that second layer doped polysilicon film 3b overlaps with a part of the upper layer of the first electrode.

Thus, a charge transfer electrodes of a double electrode structure are formed. The rest is the same as the first embodiment, that is, as the upper layers thereon, the pattern of light-shielding film 71, BPSG film 72 having a thickness of 700 nm, insulating film 73 (a passivation film) comprising P—SiN, and flattening layer 74 comprising a transparent resin film are formed.

After that, color filter 50, flattening layer 61 and microlens 60 are formed, thus a solid-state imaging device as shown in FIG. 4 is obtained.

According to the method, a high quality silicon oxide film is formed on the side wall according to thermal oxidation by using, as the antioxidizing film, a double film comprising a high quality silicon oxide film formed by a reduced pressure CVD method and a silicon nitride film formed by a reduced pressure CVD method, so that a high pressure resisting and highly reliable electrode insulating film can be formed.

In the solid-state imaging device in the second embodiment, by removing the antioxidizing film in the area where the first and second electrodes are opposing to each other, an antioxidizing film is not present in the vicinity of the upper edge of the first electrode where giving and receiving of electric charge are mainly done and the upper edge has the same dielectric constant as that of the side wall, and it follows that uniform electrode insulating films are present all around the region, so that the convergence of the charge can be inhibited and reliability can be improved.

As has been described above, the invention can provide a solid-state imaging device that is capable of inhibiting the occurrence of a leak attributable to the growth of a protrusion by stress in thermal oxidation, and can provide, in fining of the solid-state imaging device, a highly reliable device structure while reducing the heat treatment temperature such as thermal oxidation in a degree of not generating the extension of diffusion length. Therefore, the manufacturing method in the invention is effective to manufacture a fine and high sensitivity solid-state imaging device.

This application is based on Japanese Patent application JP2004-188404, filed Jun. 25, 2005, the entire content of which is hereby incorporated by reference. This claim for priority benefit is being filed concurrently with the filing of this application.

What is claimed is:

1. A solid-state imaging device comprising:
   a photoelectric conversion portion; and
   a charge transfer portion equipped with charge transfer electrodes that transfers a charge generated in the photoelectric conversion portion, the charge transfer electrodes comprising: a first electrode including a first layer electric conductive film; and a second electrode including a second layer electric conductive film provided contiguously to the first electrode with an electrode insulating film therebetween,
   wherein the first electrode has a side wall coated with a silicon oxide film that is the electrode insulating film formed by oxidation of the side wall in a state that an upside thereof is coated with an antioxidizing film.

2. The solid-state imaging device as claimed in claim 1, wherein the antioxidizing film is formed on the first electrode through a silicon oxide film formed by a CVD method.

3. The solid-state imaging device as claimed in claim 1, wherein the antioxidizing film is a silicon nitride film.

4. The solid-state imaging device as claimed in claim 1, wherein the first and second electrodes are juxtaposed to each other on a surface of a semiconductor substrate with a gate oxide film therebetween to constitute a single layer structural charge transfer electrode.

5. The solid-state imaging device as claimed in claim 1, wherein the second electrode is formed so as to overlap with a part of the upper layer of the first electrode and constitute a double electrode structural charge transfer electrode.

6. The solid-state imaging device as claimed in claim 5, which is constituted so that an antioxidizing film is not present in a region where the first and second electrodes are opposite to each other.

7. The solid-state imaging device as claimed in claim 1, wherein one of the first layer electric conductive film and the second layer electric conductive film is a silicon-based electric conductive film.

8. The solid-state imaging device as claimed in claim 7, wherein the silicon-based electric conductive film is a doped amorphous silicon film.

9. The solid-state imaging device as claimed in claim 7, wherein the silicon-based electric conductive film is a doped polysilicon film.

* * * * *